United States Patent
Schultz et al.

(10) Patent No.: US 9,419,125 B1
(45) Date of Patent: Aug. 16, 2016

(54) DOPED BARRIER LAYERS IN EPITAXIAL GROUP III NITRIDES

(71) Applicant: Raytheon Company, Waltham, MA (US)

(72) Inventors: Brian D. Schultz, Lexington, MA (US); Abbas Torabi, North Andover, MA (US); Eduardo M. Chumbes, Andover, MA (US); Shahed Reza, Boxborough, MA (US); William E. Hoke, Wayland, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/740,703

(22) Filed: Jun. 16, 2015

(51) Int. Cl.
| | |
|---|---|
| *H01L 29/00* | (2006.01) |
| *H01L 21/00* | (2006.01) |
| *H01L 29/778* | (2006.01) |
| *H01L 29/20* | (2006.01) |
| *H01L 29/205* | (2006.01) |
| *H01L 29/207* | (2006.01) |
| *H01L 29/66* | (2006.01) |
| *H01L 21/02* | (2006.01) |

(52) U.S. Cl.
CPC ........ *H01L 29/7787* (2013.01); *H01L 21/0254* (2013.01); *H01L 29/2003* (2013.01); *H01L 29/205* (2013.01); *H01L 29/207* (2013.01); *H01L 29/66462* (2013.01)

(58) Field of Classification Search
CPC ............... H01L 29/7787; H01L 29/66462; H01L 29/207; H01L 29/205; H01L 29/2003; H01L 21/025
See application file for complete search history.

(56) References Cited

U.S. PATENT DOCUMENTS

| | | | | |
|---|---|---|---|---|
| 8,975,655 | B2 * | 3/2015 | Yang | H01L 33/382 257/100 |
| 9,041,065 | B2 * | 5/2015 | Wu | H01L 29/2003 257/183 |
| 2005/0009310 | A1 | 1/2005 | Vaudo et al. | |
| 2010/0230687 | A1 | 9/2010 | Hashimoto et al. | |
| 2014/0054603 | A1 * | 2/2014 | Wu | H01L 29/2003 257/76 |
| 2014/0183545 | A1 | 7/2014 | Hoke | |
| 2014/0374772 | A1 * | 12/2014 | Yang | H01L 33/382 257/76 |

* cited by examiner

*Primary Examiner* — Nikolay Yushin
(74) *Attorney, Agent, or Firm* — Daly, Crowley, Mofford & Durkee, LLP

(57) ABSTRACT

A semiconductor structure having a Group III-N buffer layer and a Group III-N barrier layer in direct contact to form a junction between the Group III-V buffer layer the Group III-N barrier layer producing a two dimensional electron gas (2DEG) channel, the Group III-N barrier layer having a varying dopant concentration. The lower region of the Group III-N barrier layer closest to the junction is void of intentionally introduced dopant and a region above the lower region having intentionally introduced, predetermined dopant with a predetermined doping concentration above $1\times10^{17}$ atoms per $cm^3$.

22 Claims, 5 Drawing Sheets

DOPED BARRIER LAYERS IN EPITAXIAL GROUP III NITRIDES

TECHNICAL FIELD

This disclosure relates generally to semiconductor structures and more particularly to Group III-Nitride (III-N) semiconductor structures.

BACKGROUND

As is known in the art, High Electron Mobility Transistors (HEMTs) based on group III nitrides require low buffer and low gate current leakages to minimize losses. GaN HEMTs grown by Molecular Beam Epitaxy (MBE) have traditionally shown good "on"-state performance, but high leakage in the "off"-state.

As is also known in the art, doped semiconductors are semiconductors which contain impurities, foreign atoms which are incorporated into the crystal structure of the semiconductor. These impurities can either be unintentional due to lack of control during the growth of the semiconductor or they can be added on purpose to provide free carriers in the semiconductor. For example, in growing layers of a HEMT using MBE, contaminants in the MBE equipment introduce background material or so-called UnIntentially Doped (UID) regions in the MBE grown layer. These UID regions typically have doping concentrations of $5 \times 10^{14}$ to $5 \times 10^{16}$ atoms per $cm^3$ or less. Thus, as used herein, an UID region or layer is considered as comprising material or particles that are unintentional due to lack of control during the growth of the semiconductor and/or have doping concentration typically of $5 \times 10^{14}$ to $5 \times 10^{16}$ atoms per $cm^3$ or less.

SUMMARY

In accordance with the present disclosure, a semiconductor structure is provided having a Group III-N buffer layer and a Group III-N barrier layer in direct contact with the Group III-N buffer layer to form a junction between the Group III-N buffer layer and the Group III-N barrier layer, one of the layers having a band gap lower than the other one of the layers producing a two dimensional electron gas (2DEG) channel in the one of the layers having the lower one of the band gaps. The Group III-N barrier layer comprises a lower unintentionally doped region closest to the junction and an intentionally doped region above the lower region.

In one embodiment, a semiconductor structure is provided having a Group III-N buffer layer and a Group III-N barrier layer in direct contact to form a junction between the Group III-N buffer layer and the Group III-N barrier layer, one of the layers having a band gap lower than the other one of the layers producing a two dimensional electron gas (2DEG) channel in the one of the layers having the lower one of the band gaps, the Group III-N barrier layer having a varying dopant concentration. The lower region of the Group III-N barrier layer closest to the junction is void of intentionally introduced dopants and a region above the lower region having an intentionally introduced, predetermined dopant with the predetermined doping concentration above $1 \times 10^{17}$ atoms per $cm^3$.

In one embodiment, the Group III-N barrier layer has a lower region closest to the junction with a doping concentration typically of $5 \times 10^{14}$ to $5 \times 10^{16}$ atoms per $cm^3$ or less and a region above the lower region with a predetermined dopant having a predetermined doping concentration greater than $1 \times 10^{17}$ per $cm^3$.

In one embodiment, the barrier layer is AlGaN and the buffer layer is GaN.

In one embodiment, the doping concentration in a region of the III-N barrier layer between the junction and a predetermined distance, D, from the junction is at least 10 times less than the doping concentration in a region of the III-N barrier layer a distance greater than the predetermined distance, D.

In one embodiment, the predetermined distance is in greater than 1.5 nm.

In one embodiment, wherein the electric carrier generating barrier layer is $Al_xGa_{1-x}N$, $Al_xIn_{1-x}N$, or $(Al_yGa_{1-y})_xIn_{1-x}N$ with $0<X\le1$ and $0<Y\le1$.

In one embodiment, the predetermined dopant is carbon (C), beryllium (Be), chromium (Cr), vanadium (V), magnesium (Mg), zinc (Zn) or iron (Fe).

In one embodiment, the predetermined dopant captures charge carriers arising from contaminants or crystalline defects within the electric carrier generating layer.

In one embodiment, a method is provided forming a semiconductor structure. The method includes forming a Group III-N buffer layer with a Group III-N barrier layer in direct contact, one of the layers being formed with a band gap lower than the other one of the layers producing a two dimensional electron gas (2DEG) channel in the one of the layers having the lower one of the band gaps. The forming of the Group III-N barrier layer comprises introducing a predetermined dopant during a stage of the Group III-N barrier layer formation subsequent to an initial stage of forming the Group III-N barrier layer while inhibiting the predetermined dopant from being introduced into the Group III-N barrier layer during the initial stage of the Group III-N barrier layer formation.

In one embodiment, the Group III-N barrier layer forming comprises varying the doping concentration of a predetermined dopant as a function of the Group III-N barrier layer thickness during the Group III-N barrier layer formation.

In one embodiment, the Group III-N barrier layer forming comprises varying the amount of the dopant concentration of the predetermined dopant as a function of distance from the junction.

In one embodiment, the predetermined dopant introduced in the region in the Group III-N barrier layer above the lower region has a dopant concentration above $1 \times 10^{17}$ atoms per $cm^3$.

The inventors have recognized that in AlGaN/GaN HEMTs the electron wave function resides primarily in the lower band gap material of the junction interface and does not extend very deep in the barrier layer itself. Therefore, by having a predetermined distance closest to the junction interface unintentionally doped (UID) to at least 1.5 nm, the performance may be maintained and the barrier layer itself can be made more resistive to electron transport through doping of atoms like carbon or beryllium in the region greater than 1.5 nm away from the interface or junction. Thus, such structure, by moving the intentional or predetermined dopant (e.g. carbon or beryllium) away from the junction, leakage current is reduced while device performance is maintained and the impact on current collapse is also reduced.

By selectively doping part of the semiconducting barrier layer during the growth process with carbon or beryllium abruptly and controllably to levels above $1 \times 10^{17}$ atoms per $cm^3$, the "off"-state leakage current from the gate and drain contacts in a HEMT is reduced. The carbon and/or beryllium selectively added in a portion of the semiconducting barrier layer increase the nitride barrier layer resistance to electron transport while not degrading the overall performance of the device. Thus, adding a spacer layer with a doping concentration of $5 \times 10^{16}$ atoms per $cm^3$ or less in the barrier layer (the lower UID region of the barrier layer) reduces impact on the DC characteristics of the heterojunction structure and allows some tailoring of the overall device performance.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
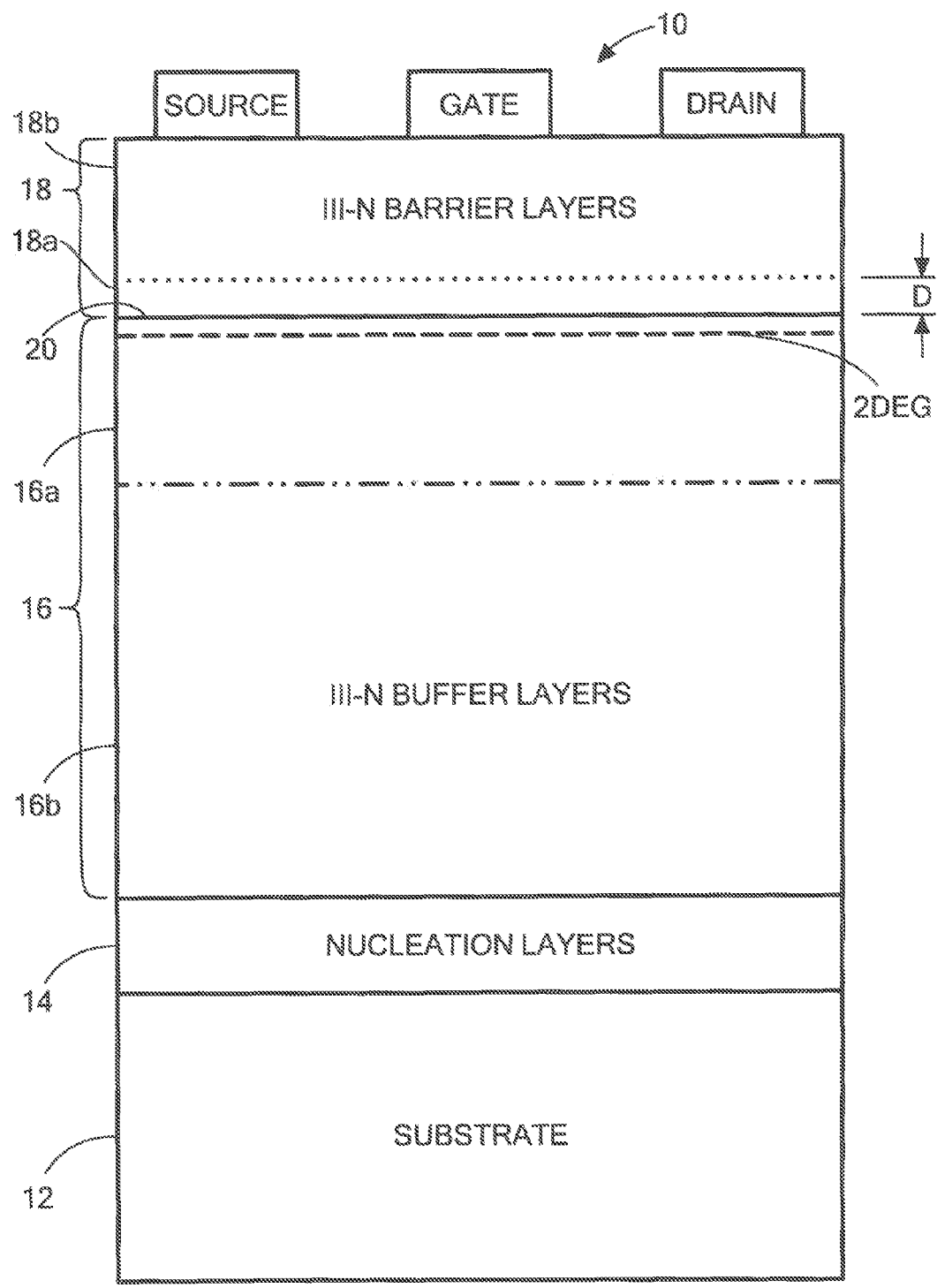
FIG. 1 is a diagrammatical cross-sectional sketch of a HEMT according to the disclosure.

Referring now to FIG. 1, a HEMT device 10 is shown having a substrate 12, for example, silicon carbide (SiC), silicon (Si) or Sapphire. A nucleation layer (NL) structure 14 is deposited on substrate 12. The nucleation layer (NL) structure 14 helps transition between various bonding, lattice, valance, and polycrystalline type mismatches that exist between the substrate 12 and a buffer layer structure 16. The nucleation layer structure 14 can be a few atomic layers or contain multiple material layers over microns of growth. The buffer layer structure 16 includes one or more Group-III nitride materials and is typically divided into two regions. The upper portion of the buffer layer structure 16a, or channel region, is substantially free of dopant, (that is it is an UID region) while the lower region 16b adjacent to the nucleation layer 14 includes any suitable conventional dopant to form an insulating region 16b.

Formed on, and in direct contact with, the upper or channel region 16a of the buffer layer 16 by Molecular Beam Epitaxy (MBE) is a barrier layer 18, here a Group III-N layer. More particularly, during the initial stage of the MBE process of growing a portion of the barrier layer 18a is intentionally left undoped; thus layer 18a is an UID layer having doping concentration levels of $5 \times 10^{16}$ atoms per $cm^3$ or less. The MBE process then, subsequent to the initial stage of the MBE process (that is, after forming the UID lower portion 18a) introduces a predetermined dopant, here for example carbon, into the MBE growth process forming the upper portion 18B of the barrier layer. Thus, subsequent to the initial stage of the MBE process, the MBE process varies the predetermined dopant in the barrier layer 18 as a function of distance, D, from a junction 20 between the buffer layer 16 (more particularly between the layer 16a and the barrier layer 18.

More specifically, the Group III-N buffer layer 16 with a Group III-N barrier layer 18 is formed in direct contact. Here for example, the buffer layer 16 has a lower band gap than the barrier layer 18, and therefore the heterojunction 20 between the buffer layer 16 and the barrier layer 18 produces a two dimensional electron gas (2DEG) channel in the one of the layers having the lower one of the band gaps here shown in an upper region 16a of the buffer layer 16 in FIG. 1. The Group III-N barrier layer 18 forming process comprises inhibiting the predetermined dopants from being introduced into the Group III-N barrier layer 18 during an initial stage of the MBE process to provide a lower region 18a of the Group III-N barrier layer closest to the junction 20 substantially void of the predetermined dopant (that is, the lower region 18a is an UID region) and subsequently introducing the predetermined dopant, here for example, carbon into a region 18b in the Group III-N barrier layer above the lower region 18a (that is, introduced subsequent to the initial stage of the MBE process). The Group III-N barrier layer 18 forming comprises varying the amount of the predetermined dopant concentration, here for example carbon, subsequent to the initial stage of the MBE process as a function of the distance, D, from the junction 20.

Figure 2:
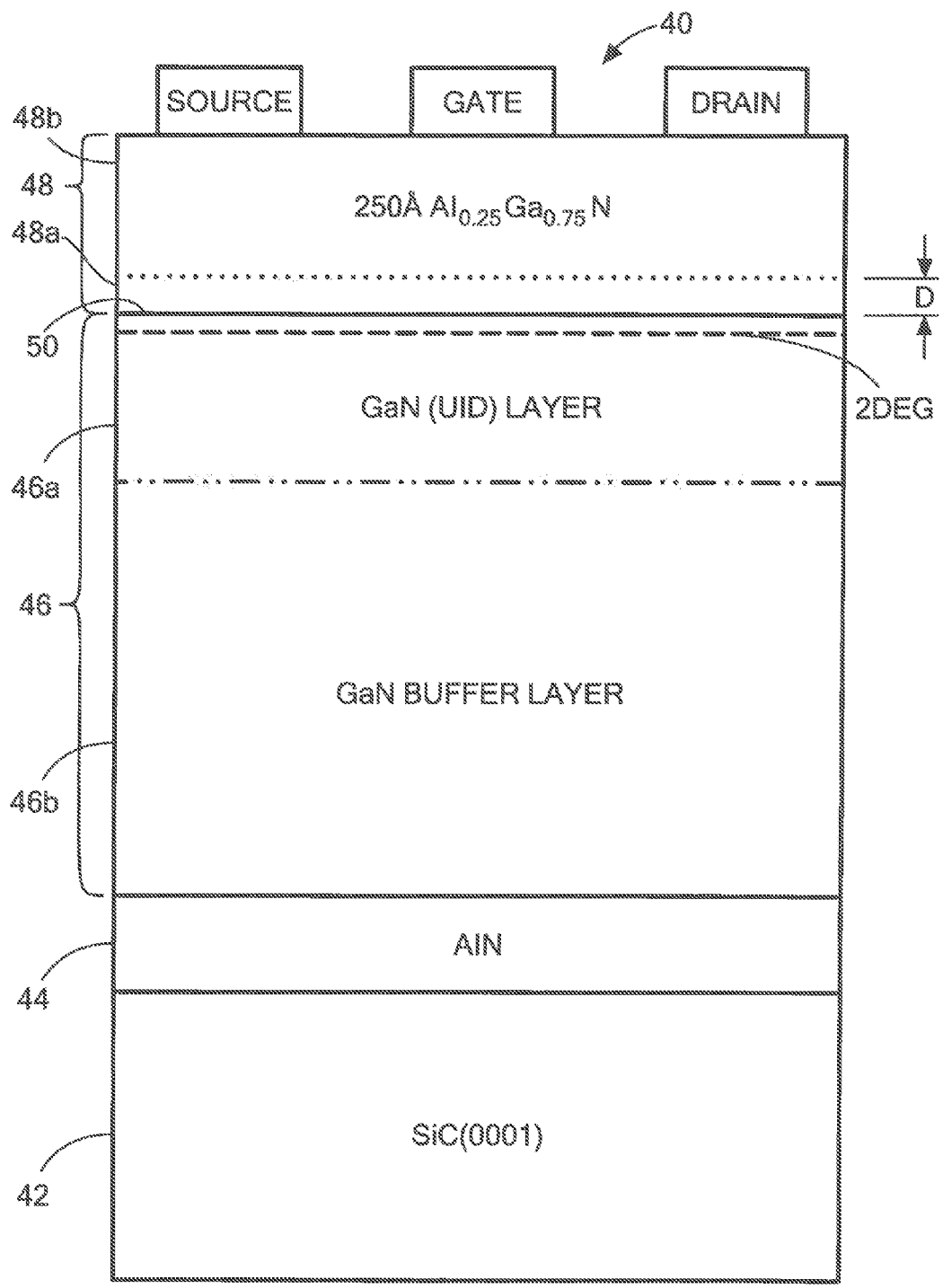
FIG. 2 is a diagrammatical cross-sectional sketch of an AlGaN/GaN HEMT according to the disclosure.

Referring now to FIG. 2, an example of a Group III-N HEMT 40 is shown starting with a SiC (0001) crystallographic orientation substrate 42, and a 20 to 100 nm thick layer of Aluminum Nitride (AlN) nucleation layer 44 formed on the SiC substrate 42. The buffer layer structure 46 is a 1-3 micron thick Group III-N semiconductor buffer layer structure 46, here, for example, GaN formed by, here for example, by Molecular Beam Epitaxy (MBE), on the AlN layer 44. More particularly, the upper portion 46a, or channel region, of the buffer layer 46 is substantially free of dopant, (that is it is an UID region) while the lower region 46b adjacent to the nucleation layer 14 includes any suitable conventional dopant to form an insulating region 46b.

Formed on, and in direct contact with, the upper or channel region 46a of the buffer layer 46 by MBE is a barrier layer 48, here for example a 250 Angstroms thick layer of $Al_{0.25}Ga_{0.75}N$. Here again, the Group III-N barrier layer 48 forming process comprises inhibiting the predetermined dopants introduced subsequent to the initial stage of the MBE process from being introduced into the Group III-N barrier layer 48 during an initial stage MBE process to provide a lower region 48a of the Group III-N barrier layer closest to the junction 40 substantially void of the predetermined dopant introduced subsequent to the initial stage of the MBE process (that is, the lower region 48a is an UID region) and subsequently introducing a predetermined dopant, here for example, carbon into a region 48b in the Group III-N barrier layer above the lower region 48a (that is, introduced subsequent to the initial stage of the MBE process). The Group III-N barrier layer 48 MBE forming comprises varying the amount of the predetermined dopant concentration, here for example carbon, subsequent to the initial stage of the MBE process as a function of the distance, D, from the junction 40.

It is noted that the Aluminum Gallium Nitride ($Al_xGa_{1-x}N$) layer 48 is on, and in direct contact with the barrier layer 46 causing spontaneous and piezoelectric polarization charge to form in the top-most portion, or channel region, 46a of the smaller band-gap GaN layer 46. More particularly, the Aluminum Gallium Nitride ($Al_xGa_{1-x}N$) layer 48 is an electric carrier generating layer disposed on the Group III-N layer 46 to generate electric carriers within the III-N layer 46 by polarization effects; more particularly, a 2DEG channel in an upper region of the buffer layer 46a.

The HEMT device structure includes source, drain, and gate, electrodes, as shown in FIG. 1 and FIG. 2. For example, referring to FIG. 2, the gate electrode controls the flow of the electric carriers passing through either the GaN layer 46 or the electric carrier generating layer 48 or both layers, depending on the bias voltage, between the source, gate, and drain electrodes. It should be understood that it is the Group III-N layer or layers that form the upper (closer to the surface) region of the heterojunction 40 that is responsible for producing the 2DEG and separates the junction from a gate contact G used to modulate the charge in the 2DEG. The gate contact may be directly deposited on the III-N barrier layers or separated from the III-V barrier layers by one or more electrically insulating layers.

Figure 3A:
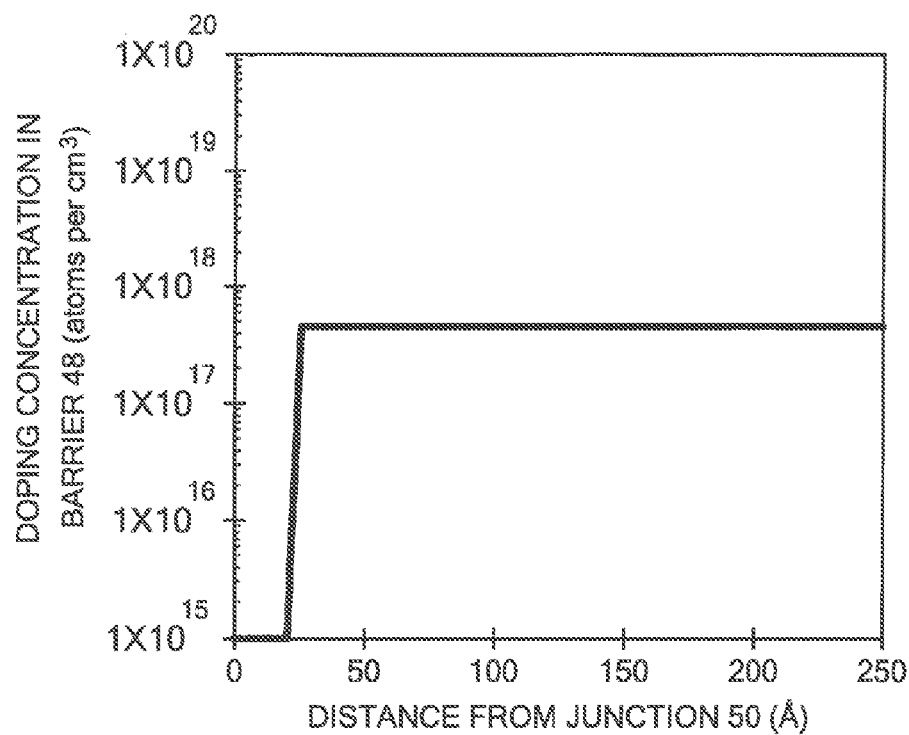
FIGS. 3A-3E are variety of curves showing doping concentration of a predetermined dopant in a barrier layer of the HEMT of FIG. 2 during a stage of fabrication of the barrier layer, subsequent to an initial stage in the fabrication of the barrier layer, as a function of distance, D, from a junction of the HEMT between a buffer layer of the HEMT and the barrier layer.
Figure 3B:
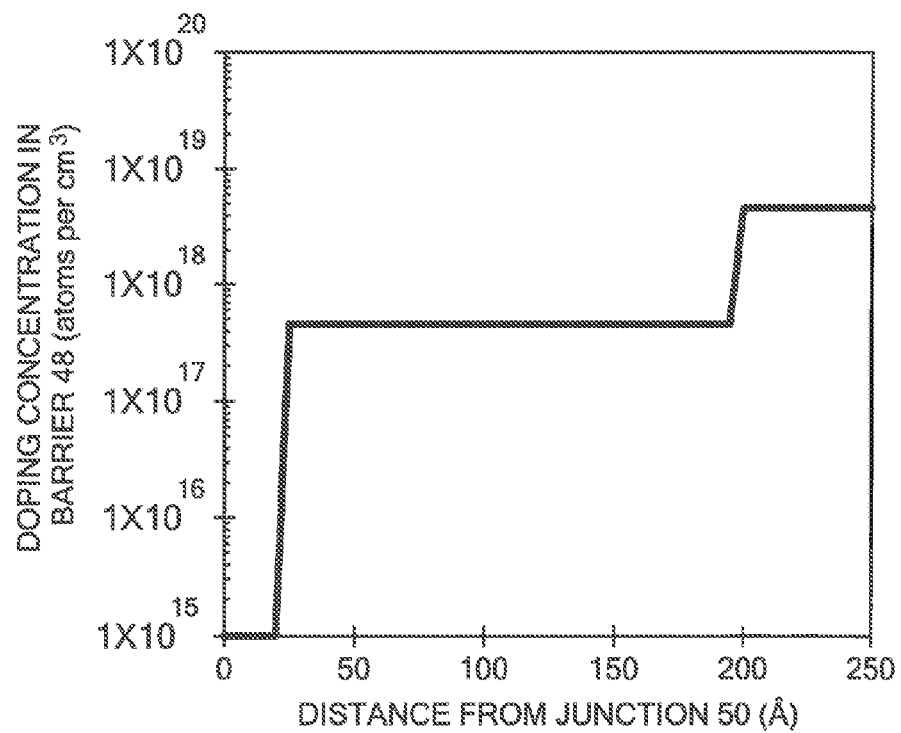
Figure 3C:
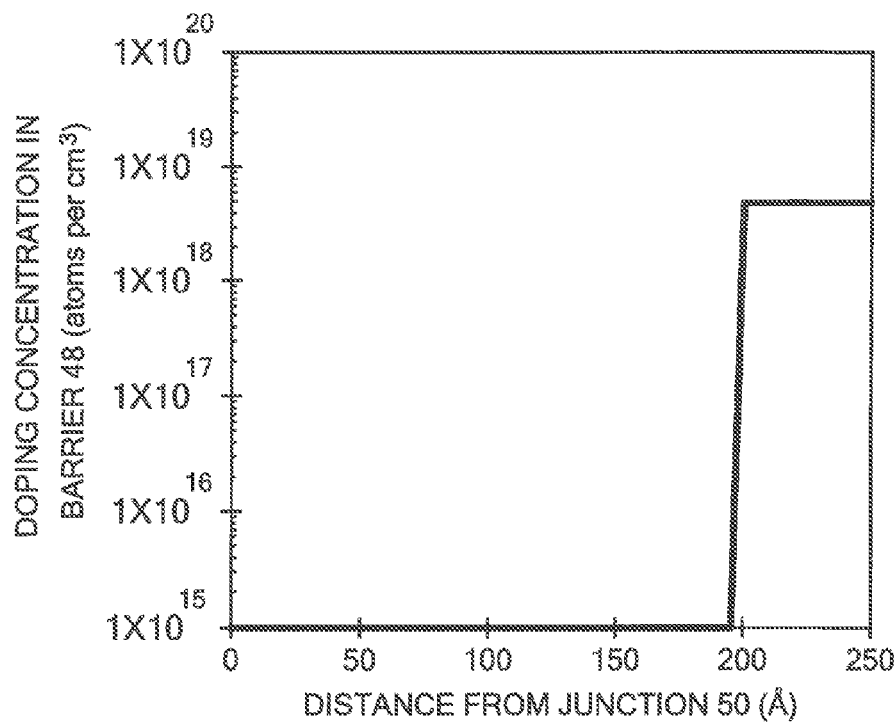
Figure 3D:
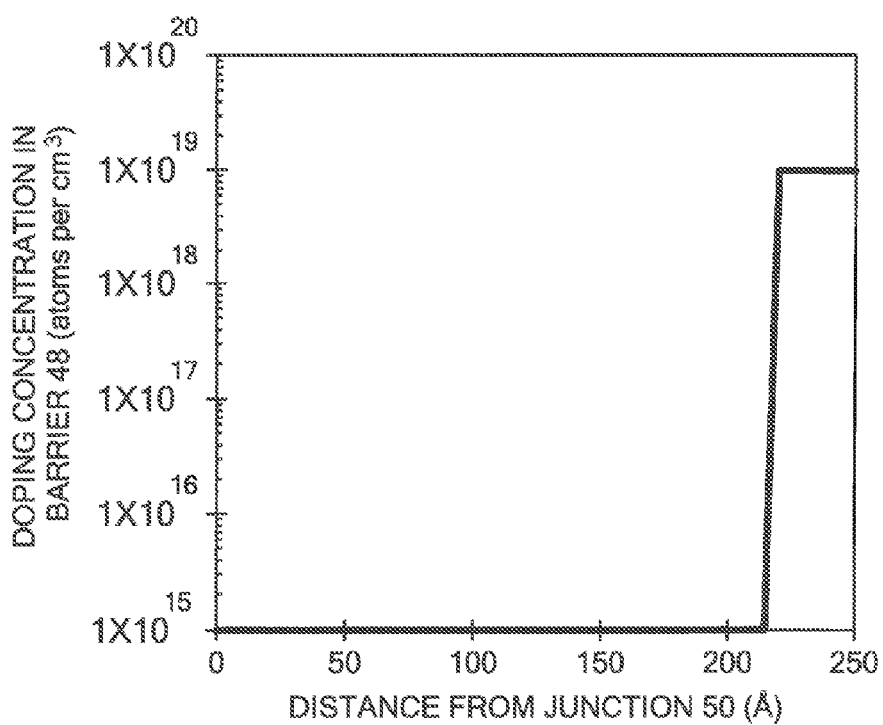
Figure 3E:
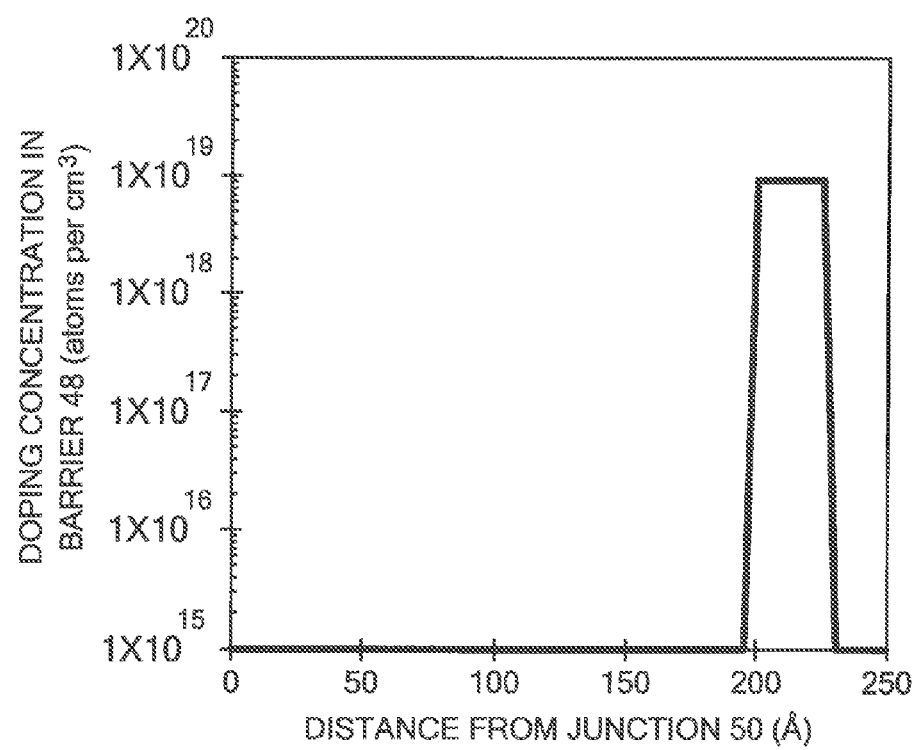

Referring to FIGS. 3A-3E several examples of doping profiles are shown. The following should be noted from these profiles: first, the UID layer 48$a$ has, in this example, a doping concentration of $1 \times 10^{15}$ carbon atoms per cm$^3$; the minimum distance between the junction 50 and the peak doping concentration is 1.5 nm; the minimum carbon doping concentration is $4 \times 10^{17}$ carbon atoms per cm$^3$. Thus, referring now to FIGS. 3A-3E, a variety of curves are presented showing doping concentration of the predetermined dopant, here for example carbon, in the barrier layer 48, particularly in region 48$b$, as a function of distance, D, from the junction 50. In FIG. 3A, the lower region is approximately 20 Angstroms from the junction 50. The doping is substantially a step function in that the doping concentration abruptly jumps (for example, the doping concentration increases by a half an order of magnitude (50 percent) over 5 Angstroms), here for example, to a doping concentration of approximately $7 \times 10^{17}$ atoms per cm$^3$. FIG. 3B shows a two-step doping concentration profile that includes the same step in doping concentration near the junction 50 as FIG. 3A, but contains a second step up in doping concentration approximately 200 Å from the junction. FIG. 3C, shows a lower region approximately 190 Angstroms from the junction 50 and an abrupt jump in the doping concentration to approximately $7 \times 10^{18}$ atoms per cm$^3$ for the remainder of the barrier region 48. FIG. 3D, shows a lower region approximately 220 Angstroms from the junction 50 and an abrupt jump in the doping concentration to approximately $1 \times 10^{19}$ atoms per cm$^3$ for the remainder of the barrier region 48. FIG. 3E shows a delta-type doing concentration profile where the predetermined dopant portion of the upper region 48$b$ of the barrier layer 48 returns to an UID region; that is, in FIG. 3E, after introducing the predetermined dopant beginning at a distance approximately 190 Angstroms from the junction 50, the introduction of the predetermined dopant terminates after a growth of approximately 50 Angstroms so that there is an UID region from about 240 Angstroms to the end of the formation of the barrier layer 48.

A number of embodiments of the disclosure have been described. Nevertheless, it will be understood that various modifications may be made without departing from the spirit and scope of the disclosure. For example, the electric carrier generating layer 18 may be $(Al_yGa_{(1-y)})_xIn_{1-x}N$, $Al_xIn_{1-x}N$, with $0<X\leq 1$ and $0<Y\leq 1$ or AlN for example. The barrier layers for a GaN-based HEMT could comprise AlGaN, InAlN, or AlN. The barrier layers for a GaN-based HEMT could be composed of multiple group III-N materials, for example, AlN and AlGaN, AlGaN and GaN, or AlN and AlGaN and GaN. Further, other dopants other than carbon may be used, for example, beryllium, chromium, vanadium, magnesium, zinc, or iron. Further, it should be understood that other single compound substrates 12 may be used such as free standing Group III-N substrates or any crystalline substrate that enables the deposition of one or more crystalline Group III nitride overlayers with a single well defined crystalline orientation with respect to the substrate 12 crystal structure. This includes heterojunction structures formed via the deposition of one or more crystalline materials on another crystalline material, or formed by bonding one or more layers together to define a surface region that is crystalline and supports the crystalline growth of one or more Group III nitride materials. The gate metal may be in contact with the group-III nitride to from a Schottky contact or contain one or more dielectrics between the group III-N barrier layer and the gate metal to form a Metal-Insulator-Semiconductor HEMT.

Accordingly, other embodiments are within the scope of the following claims. For example, other material may be used. For example, while Aluminum was used in the barrier layer 48 of the structure shown in FIG. 2 thereby resulting in the barrier layer 48 having a higher bandgap than the bang gap of the buffer layer 46, using for example Indium in place of Aluminum for the dopant in barrier layer 48 would result in the barrier layer 48 having a layer band gap than the buffer layer 46. In either embodiment, the barrier layer would be dispose between the buffer layer and the gate electrode of the device.

What is claimed is:

1. A Field Effect Transistor, comprising:
   a semiconductor structure, comprising:
      a Group III-N buffer layer;
      a Group III-N barrier layer in direct contact with the Group III-N buffer layer to form a junction between the Group III-N buffer layer and the Group III-N barrier layer producing a two dimensional electron gas (2DEG) in the one of the layers having the lower one of the band gaps;
      a gate electrode, disposed between a source electrode and a drain electrode, for modulating charge in the 2DEG; and
      wherein the Group III-N barrier layer comprises a lower unintentionally doped region closest to the junction and an intentionally doped region above the lower unintentionally doped region.

2. The Field Effect Transistor recited in claim 1 wherein the intentionally doped region includes a dopant in the region above the lower unintentionally doped region selected to increase barrier layer resistance to electron transport to reduce leakage current between the gate electrode and one of the source electrode and drain electrode.

3. A Field Effect Transistor comprising:
   a semiconductor structure having a gate electrode disposed between a source electrode and a drain electrode, the semiconductor structure, comprising:
      a Group III-N buffer layer;
      a Group III-N barrier layer in direct contact with the Group III-N buffer layer to form a junction between the Group III-N buffer layer and the Group III-N barrier layer producing a two dimensional electron gas (2DEG) in the structure;
      wherein the Group III-N barrier layer comprises a lower unintentionally doped region closest to the junction and an intentionally doped region above the lower unintentionally doped region; and
      wherein the intentionally doped region includes a dopant in the region above the lower unintentionally doped region selected to increase barrier layer resistance to electron transport to reduce leakage current between the gate electrode and one of the source electrode and drain electrode.

4. The Field Effect Transistor recited in claim 3 wherein the gate electrode modulates charge in the 2DEG and wherein the barrier layer is $Al_xGa_{1-x}N$, $Al_xIn_{1-x}N$, or $(Al_yGa_{1-y})_xIn_{1-x}N$ with $0<X\leq 1$ and $0<Y\leq 1$.

5. The Field Effect Transistor recited in claim 4 wherein the dopant in the intentionally doped region above the lower unintentionally doped region is carbon, beryllium, chromium, vanadium, magnesium, zinc, or iron.

6. The Field Effect Transistor recited in claim 3 wherein the region above the lower unintentionally doped region is spaced from the junction a distance greater than 1.5 nm.

7. The Field Effect Transistor recited in claim 3 wherein the gate electrode modulates charge in the 2DEG.

8. A semiconductor structure, comprising:
a Group III-N buffer layer;
a Group III-N barrier layer in direct contact with the Group III-N buffer layer to form a junction between the Group III-N buffer layer and the Group III-N barrier layer, one of the layers having a band gap lower than the other one of the layers producing a two dimensional electron gas (2DEG) channel in the one of the layers having the lower one of the band gaps; and
wherein the Group III-N barrier layer has a lower region closest to the junction having a doping concentration of $5\times10^{16}$ atoms per cm$^3$ or less and a region above the lower region with a predetermined dopant having a doping concentration greater than $1\times10^{17}$ atoms per cm$^3$.

9. A semiconductor structure, comprising:
a Group III-N buffer layer;
a Group III-N barrier layer in direct contact with the Group III-N buffer layer to form a junction between the Group III-N buffer layer and the Group III-N barrier layer, one of the layers having a band gap lower than the other one of the layers producing a two dimensional electron gas (2DEG) channel in the one of the layers having the lower one of the band gaps; and
wherein the Group III-N barrier layer has predetermined dopant with a predetermined doping concentration varying with distance from the junction between the Group III-N buffer layer and the Group III-N barrier layer.

10. The semiconductor structure recited in claim 9, wherein a doping concentration in a region of the Group III-N barrier layer between the junction and a predetermined distance, D, from the junction is at least 10 times less than the doping concentration in a region of the Group III-N barrier layer a distance greater than the predetermined distance, D.

11. The semiconductor structure recited in claim 10 wherein the predetermined distance, D, is in greater than 1.5 nm.

12. A semiconductor structure, comprising:
a Group III-N buffer layer;
a Group III-N barrier layer in direct contact with the Group III-N buffer layer to form a junction between the Group III-N buffer layer and the Group III-N barrier layer, one of the layers having a band gap lower than the other one of the layers producing a two dimensional electron gas (2DEG) channel in the one of the layers having the lower one of the band gaps; and
wherein the doping of barrier layer has a predetermined dopant with a predetermined doping concentration in excess of $1\times10^{17}$ atoms per cm$^3$ over only a fraction of the barrier layer thickness.

13. The semiconductor structure recited in claim 12 wherein the doping of barrier layer has doping concentration in excess of $1\times10^{17}$ per cm$^3$ over at least 5% of the barrier thickness.

14. A semiconductor structure, comprising:
a Group III-N buffer layer;
a Group III-N barrier layer in direct contact with the Group III-N buffer layer to form a junction between the Group III-N buffer layer and the Group III-N barrier layer, one of the layers having a band gap lower than the other one of the layers producing a two dimensional electron gas (2DEG) channel in the one of the layers having the lower one of the band gaps; and
wherein Group III-N barrier layer has a predetermined dopant with a predetermined doping concentration in excess of $1\times10^{17}$ atoms per cm$^3$ with at least 1.5 nm of a portion of the barrier layer closest to the 2DEG channel being less than $1\times10^{17}$ atoms per cm$^3$.

15. A semiconductor structure, comprising:
a Group III-N buffer layer;
a Group III-N barrier layer in direct contact with the Group III-N buffer layer to form a junction between the Group III-N buffer layer and the Group III-N barrier layer, one of the layers having a band gap lower than the other one of the layers producing a two dimensional electron gas (2DEG) channel in the one of the layers having the lower one of the band gaps; and
wherein the Group III-N barrier layer has a lower region closest to the junction with unintentional impurity dopant (UID) and a region above the lower region with a predetermined dopant having a predetermined doping concentration varying with distance from a junction between the Group III-N buffer layer and the Group III-N barrier layer.

16. A semiconductor structure comprising:
a Group III-N buffer layer and a Group III-N barrier layer in direct contact to form a junction between the Group III-V buffer layer and the Group III-N barrier layer producing a two dimensional electron gas (2DEG), the Group III-N barrier layer having a varying dopant concentration; and
wherein the lower region of the Group III-N barrier layer closest to the junction is substantially void of intentionally introduced dopant and a region above a lower region having intentionally introduced, predetermined dopant with a predetermined doping concentration above $1\times10^{17}$ atoms per cm$^3$.

17. A method is provided forming a semiconductor structure, comprising:
forming a Group III-N buffer layer with a Group III-N barrier layer in direct contact to form a junction between the Group III-N buffer layer and the Group III-N barrier layer producing a two dimensional electron gas (2DEG);
wherein the Group III-N barrier layer forming comprises introducing a predetermined dopant during a stage of the Group III-N barrier layer subsequent to an initial stage of forming the Group III-N barrier layer and inhibiting the predetermined dopant from being introduced into the Group III-N barrier layer during the initial stage in the formation of the Group III-N barrier layer.

18. A method for forming a semiconductor structure, comprising:
forming a Group III-N barrier layer in direct contact to form a junction between the Group III-N barrier layer and a Group III-N buffer layer to produce a two dimensional electron gas (2DEG);
wherein the Group III-N barrier layer forming comprises varying a doping concentration of a predetermined dopant as a function of the Group III-N barrier layer thickness during the Group III-N barrier layer formation.

19. The method recited in claim 18 wherein the Group III-N barrier layer forming comprises varying the amount of the dopant concentration of the predetermined dopant as a function of distance from the junction.

20. The method recited in claim 19 wherein the predetermined dopant introduced in the region in the Group III-N barrier layer above the lower region has a dopant concentration above $1\times10^{17}$ atoms per cm$^3$.

21. A Field Effect Transistor, comprising: a Group III-N buffer layer; a Group III-N barrier layer in direct contact with the Group III-N buffer layer to form a junction between the Group III-N buffer layer and the Group III-N barrier layer producing a two dimensional electron gas (2DEG) in the structure; and a gate electrode, disposed between a source electrode and a drain electrode, for modulating charge in the 2DEG; wherein the Group III-N barrier layer comprises a lower unintentionally doped region closest to the junction and an intentionally doped region above the lower unintentionally doped region; wherein the Group III-N barrier layer is $Al_xGa_{1-x}N$, $Al_xIn_{1-x}N$, or $(Al_yGa_{1-y})_xIn_{1-x}N$ with $0<X\le1$ and $0<Y\le1$; and wherein the dopant in the intentionally doped region above the lower unintentionally doped region is carbon, beryllium, chromium, vanadium, magnesium, zinc, or iron.

22. The Field Effect Transistor recited in claim 21 wherein the dopant in the intentionally doped region is selected to increase barrier layer resistance to electron transport to reduce leakage current between the gate electrode and one of the source electrode and drain electrode.

\* \* \* \* \*